United States Patent [19]

Cook

[11] 4,149,301
[45] Apr. 17, 1979

[54] MONOLITHIC SEMICONDUCTOR INTEGRATED CIRCUIT-FERROELECTRIC MEMORY DRIVE

[75] Inventor: Robert C. Cook, Palo Alto, Calif.

[73] Assignee: Ferrosil Corporation, Santa Clara, Calif.

[21] Appl. No.: 877,115

[22] Filed: Feb. 13, 1978

Related U.S. Application Data

[63] Continuation-in-part of Ser. No. 818,867, Jul. 25, 1977, abandoned.

[51] Int. Cl.² .............................................. H01G 7/00
[52] U.S. Cl. ..................................... 29/25.42; 29/604; 29/628; 357/51
[58] Field of Search .................... 29/25.42, 604, 625, 29/628; 357/51; 365/145, 149; 361/307, 313, 321; 427/126

[56] References Cited

U.S. PATENT DOCUMENTS

| | | | |
|---|---|---|---|
| 3,305,394 | 2/1967 | Kaiser et al. | 29/25.42 |
| 3,365,631 | 1/1968 | Delaney et al. | 361/321 |
| 3,405,440 | 10/1968 | Nolta et al. | 29/604 |
| 3,508,213 | 4/1970 | Hastings | 365/145 |
| 3,611,558 | 10/1971 | Carbonel | 29/604 |
| 3,623,030 | 11/1971 | Sawyer | 365/145 |
| 3,728,694 | 4/1973 | Rohrer | 361/321 |
| 3,864,817 | 2/1975 | Lapham, Jr. et al. | 29/577 |
| 3,886,582 | 5/1975 | Kobayashi | 357/22 |
| 3,939,292 | 2/1976 | Rohrer | 427/55 |

*Primary Examiner*—Lowell A. Larson
*Attorney, Agent, or Firm*—Limbach, Limbach & Sutton

[57] ABSTRACT

A monolithic semiconductor integrated circuit - ferroelectric device is disclosed together with the method of manufacturing same. The ferroelectric device preferably consists of a layer of stable ferroelectric potassium nitrate disposed between electrical contacts positioned on opposite surfaces of the ferroelectric layer. The ferroelectric layer has a thickness of less than 110 microns, and preferably falling within a range of from 100 Angstrom units to 5,000 Angstrom units. The process of manufacturing the monolithic structure is multi-stepped and is particularly adapted for fabricating a potassium nitrate ferroelectric memory on a semiconductor integrated circuit.

53 Claims, 10 Drawing Figures

MONOLITHIC SEMICONDUCTOR INTEGRATED CIRCUIT-FERROELECTRIC MEMORY DRIVE

BACKGROUND OF THE INVENTION

This application is a continuation-in-part of U.S. Application Ser. No. 818,867, filed on July 25, 1977 now abandoned.

As taught in the patent application, there have been recent breakthroughs in preparing ferroelectric devices comprising ferroelectric potassium nitrate. These devices are particularly useful as computer memory cells and preferably employ Phase III potassium nitrate in the ferroelectric phase which, in thin film form, is stable at ordinary room temperature and pressure. U.S. Pat. Nos. 3,728,694 and 3,939,292 disclose the preparation of such memory devices in detail and their teachings are incorporated herein by reference.

Various ferroelectric materials have been studied for their information storage capability. Although many materials exhibit the ferroelectric phenomenon, the predominant materials previously studied for memory application are barium totanate, potassium dihydroxide phosphate, tri-glycerine sulfate, and Phase III potassium nitrate. Phase III potassium nitrate exhibits a well defined critical switching threshold. Three conditions which must be fulfilled for a crystalline material to exhibit ferroelectricity are as follows:

1. It must have a phase transition from a polar to a non-polar structure, or at least must tend, with rising temperature, toward such a transition.
2. The polar phase must have a spontaneous polarization, that is, the unit cell must actually have a dipole moment, not only belong to a space group which is capable of such a moment.
3. The direction of the spontaneous polarization must be reversible by the applied electric field. This third condition is the most important.

The ferroelectric portion of this application and the parent application is in the form of a capacitor memory cell. Geometrically, the memory cell is a capacitor with upper and lower metal electrodes sandwiching the ferroelectric material as the dielectric. As taught in U.S. Pat. No. 3,728,694, the ferroelectric material should be less than 110 microns and preferably have a thickness within the range of from 100 Angstrom units to 1,000 Angstrom units. When the ferroelectric material is Phase III potassium nitrate, a thickness of less than 1 micron is preferred in order to achieve fast switching times. Fabricating multilayered devices such as these including metal layers are usually accomplished utilizing high vacuum deposition techniques.

The fabrication of semiconductor integrated circuits are well known and conventional. As used herein, the term "semiconductor integrated circuit" is intended to include, inter alia, MOS and bipolar designs. These devices have also, in the past, been used in conjunction with various memory devices. Never before the disclosure in U.S. Application Ser. No. 818,867, however, have semiconductor integrated circuits been fabricated with thin film ferroelectric memory devices in a monolithic structure. Furthermore, semiconductor integrated circuits have never been placed within a monolithic structure including a thin film ferroelectric memory device, preferably including Phase III potassium nitrate as the dielectric.

The monolithic semiconductor integrated circuit and ferroelectric memory device of the parent application is capable of at least $10^{10}$ read/write cycles of operation without failure. If, however, a more long-lasting memory device is sought, certain modifications are necessary which are the subject of the present invention. More specifically, it was found that beyond $10^{10}$ read/write cycles, the metal electrodes which sandwich the potassium nitrate layer eventually oxidize in response to a chemical reaction between the $KNO_3$ and the electrodes. This oxidation reaction is accelerated in the presence of an electric field and current flow across the ferroelectric layer.

It was also found that in practicing the invention of the parent application occasional failures occur due primarily to cracks in the $KNO_3$ layer. The electrode materials have a tendency to migrate into these cracks or imperfections and short out the device when electrode materials on one side of the ferroelectric layer contact electrode materials on the opposite side of the ferroelectric layer.

SUMMARY OF THE INVENTION

It is an object of the present invention to produce a monolithic semiconductor integrated circuit and ferroelectric memory device as taught in U.S. Application Ser. No. 818,867 without the drawbacks as discussed above.

It is a further object of the present invention to produce a monolithic semiconductor integrated circuit which is capable of performing an excess of $10^{10}$ read/write cycles without failure.

It is yet another object of the present invention to produce a monolithic semiconductor integrated circuit which substantially eliminated the failure rate due to the shorting out of electrodes through imperfections in the $KNO_3$ layer.

Further objects and improvements of the present invention will become apparent when reading the present disclosure.

It has been found that if a semiconductor integrated circuit and ferroelectric device can be placed within a monolithic structure, several distinct and important advantages can be realized. Firstly, the space that the two devices occupy is considerably reduced. This can be very important when one considers the micro processing applications that such devices are intended to satisfy. Secondly, it has been found that the speed of the monolithic structure is improved as compared to an individual semiconductor integrated circuit and a separate memory device in conventional form. This is primarily due to the relatively great distances which separate these individual devices in the prior art as compared to the size of the devices themselves and particularly the proximity which these devices occupy in a monolithic structure. Thirdly, the reliability problems are greatly reduced for whenever contacts and leads can be eliminated, the overall reliability of the system improves. Fourthly, a number of ferroelectric memory devices can be stacked in a single monolithic structure allowing for an expanded memory unit occupying extremely small space. Fifth, and lastly, the cost of producing a monolithic structure is less than the fabrication costs of producing an individual semiconductor integrrated circuit and separate ferroelectric chip for later connection.

The monolithic device as descibed in this and in the parent application can be fabricated by stacking one or more ferroelectric memories on top of the semiconductor integrated circuit or the ferroelelectic device can be placed on a chip surrounded by the semiconductor integrated circuit. Fabrication of both methods are quite similar and will be discussed together. The surface interconnects of the semiconductor integrated circuit can be used as the bottom electrode if the memory array occupies an area separate but on the same level as the integrated circuit. If the memory array is to be fabricated on top of the integrated circuit, the bottom electrode would be separate and insulated from the interconnects. In other words, if the monolithic device is to have the form of a ferroelectric memory unit surrounded by a semiconductor integrated circuit, then the interconnects can function as the bottom electrode. In the form of a "stacked" monolithic structure, the bottom electrode of the ferroelectric member must be separate and distinct from the conductive interconnects of the integrated circuit.

Once the interconnects are formed, a non-semiconductor dielectric layer is placed thereon through which interconnect and bonding pads are formed. The interconnect pads will be used to functionally connect the electrodes of the ferroelectric device to predetermined points on the surface of the integrated circuit. The bonding pads will later be used to connect other areas of the integrated circuit to external sources the nature of which depend upon the ultimate use of the present device. The non-semiconductor dielectric can be such things as CVD (chemical vapor deposition) glass or silicon nitride. The low temperature glass can be deposited by low temperature passivation techniques at temperatures which are normally below 400° to 900° C. Other techniques used to grow a layer of silicon dioxide or silicon nitride are by vapor deposition, epitaxial techniques to form epitaxial reaction glasses, anodic oxidation and high vacuum deposition of insulating materials such as sputtered quartz. Some of these techniques are described in detail in U.S. Pat. No. 3,886,582.

Again, by use of standard photoresist techniques, the bottom electrode can be formed. The interconnects can be the bottom electrode in a non-stacking type of device. The bottom electrode of the parent application can be metal such as aluminum, silver and gold or other conducting materials such as doped polysilicon. However, as stated previously, ordinary metals can cause the device to cease to operate after about $10^{10}$ read/write cycles due to oxidization of the electrode materials. The interconnects or electrodes of the present invention can be fabricated from a conductive metal oxide such as indium-tin oxide ($In_2O_3SnO_2$), tin oxide ($SnO_2$) and palladium oxide (PdO), or any other conductive oxide which may be deposited by any well known technique, such as by RF sputtering or reactive sputtering. If reactive sputtering is employed, a metal such as indium-tin alloy can be employed in the presence of oxygen. Similarly, any metal can be employed which will form a conductive oxide when in contact with the potassium nitrate ($KNO_3$) layer in the presence of an applied electric field.

Once the bottom electrodes are configured, and optional, second, non-semiconductor dielectric is applied uniformly over the first or bottom electrode. The non-semiconductor dielectric, such as CVD glass or silicone nitride, is then etched at certain selective spots called vias which are the predetermined areas of contact between the bottom and top electrodes which sandwich the ferroelectric layer. The second non-semiconductor dielectric layer can be eliminated if the top and bottom electrodes are of chemically dissimilar material such that the step of configuring the top electrode will not adversely affect the bottom electrode.

At this point, the ferroelectric material is applied. As stated previously, this material is preferably Phase III potassium nitrate which is formed by evaporating, under vacuum, $KNO_3$ (preferably reagent grade), and collecting the vapors as a crystalline thin film. Although not always necessary, the vacuum can then be relieved and the crystallized product cooled to room temperature. The formation of the ferroelectric layer is gone into in great detail in U.S. Pat. No. 3,728,694.

As stated previously, although the invention disclosed in U.S. Application Ser. No. 818,867 is completely operable, it was found that in practicing that invention, occasional failures occur due primarily to cracks or imperfections in the $KNO_3$ layer. The electrode materials have a tendency to migrate into these cracks and short out the device which electrode materials on one side of the ferroelectric layer contact electrode materials on the opposite side of the ferroelectric layer. This problem occurs more frequently when the top electrode is deposited via sputtering as opposed to evaporation from a heated filament. This is most likely due to the high impact energy of the material when sputtered.

In order to substantially cure this problem, a non-conductive layer(s) is applied during the same pump down or vacuum step which is employed to form the potassium nitrate layer. Any suitable insulating material can be used such as $SiO_2$, SiO or SiN, for example. The insulating layer can be applied by means of evaporation or sputtering although the latter technique is preferred. Furthermore, multiple layers of the non-conductive material can be employed to insure a thorough filling of any imperfection which may exist in the $KNO_3$ layer.

By employing any known photoresist techniques, vias are formed in the insulating layer(s) and the insulating material is sputter etched down to the surface of the $KNO_3$ layer. The photoresist can then be removed by, for example, sputtering which will result in a $KNO_3$ layer in which the cracks have been filled with an insulator. The top electrode can then be applied.

As taught in the parent application, the top electrode is applied by uniformly depositing a conductive layer (a metal or doped polysilicon) and forming the top electrode by a technique which will be more fully explained later. Like the bottom electrode of the present invention, the top electrode is fabricated from a conductive metal oxide or from a metal or metal alloy which will oxidize to form a conductive oxide. Conductive oxides are well known. Examples of such materials are indium-tin oxide ($In_2O_3SnO_2$), tin oxide ($SnO_2$) or palladium oxide (PdO).

Once the top electrode is formed, the entire surface of the device can be covered with a non-semiconductor dielectric such as CVD glass or silicon nitride to aid in protecting any exposed regions of the ferroelectric material. If the ferroelectric is Phase III potassium nitrate, great care must be taken to prevent moisture contact. If there is little chance of exposing the monolithic structure to an environment having relative high humidity, the top insulating passivation layer can be eliminated. If the passivation is, in fact, employed as a final step in the processing, this layer is etched from around the bonding and contacting pads and a conductor such as metal or doped polysilicon can be injected into these areas for connecting the top electrode through the connecting pads to predetermined spots on the semiconductor integrated circuit and for filling the bonding pads to provide external electrical contacts to other sources. As an alternative, a uniform metal layer can be applied directly over the top electrode and removed by standard photoresist techniques in unwanted areas by chemical or sputter etching for example. The top metal layer can then be used for connecting the memory array to an adjacent I.C. circuit.

Turning now to the figures.

Figure 1:
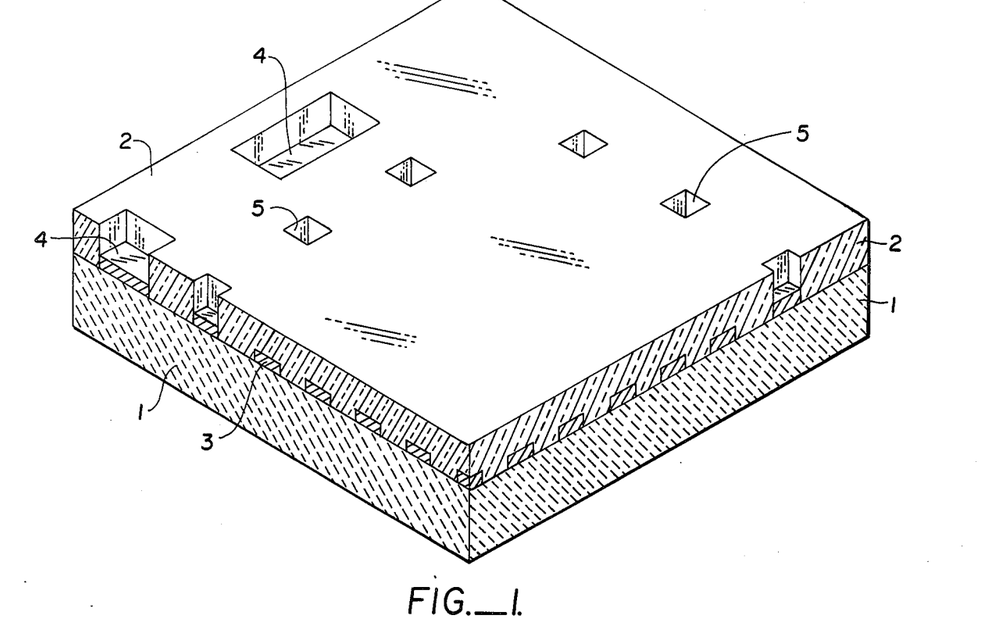
FIGS. 1 to 8 represent structures of the present invention in various stages of completion.

Turning to FIG. 1, semiconductor integrated circuit 1 is shown with interconnects 3 and non-semiconductor dielectric 2. The interconnects can comprise any acceptable conductive material such as doped polysilicon or a metal such as gold, silver or aluminum. The interconnects can be formed by standard photoresist techniques notoriously well-known in the art. If the interconnects are to be used as the bottom electrode, and thus come in contact with the ferroelectric layer, they should be fabricated from a conductive metal oxide or from a metal or metal alloy which will oxidize to form a conductive oxide as discussed previously. Upon the interconnects is placed a non-semiconductor dielectric 2 such as CVD glass or silicon nitride. The dielectric layer is intended to insulatively separate the interconnects from the bottom electrode of the ferroelectric device.

Once non-semiconductor dielectric layer 2 is uniformly applied to semiconductor integrated circuit 1 and interconnects 3, bonding pad holes 4 and contact pad holes 5 are formed. Again, these can be fabricated by employing standard photoresist techniques. The bonding pads 4 are intended to supply contact areas wherein the semiconductor integrated circuit could be functionally connected to external elements while the contact pads 5 are intended to provide functional connections between the ferroelectric device and the semiconductor integrated circuit.

Figure 2:
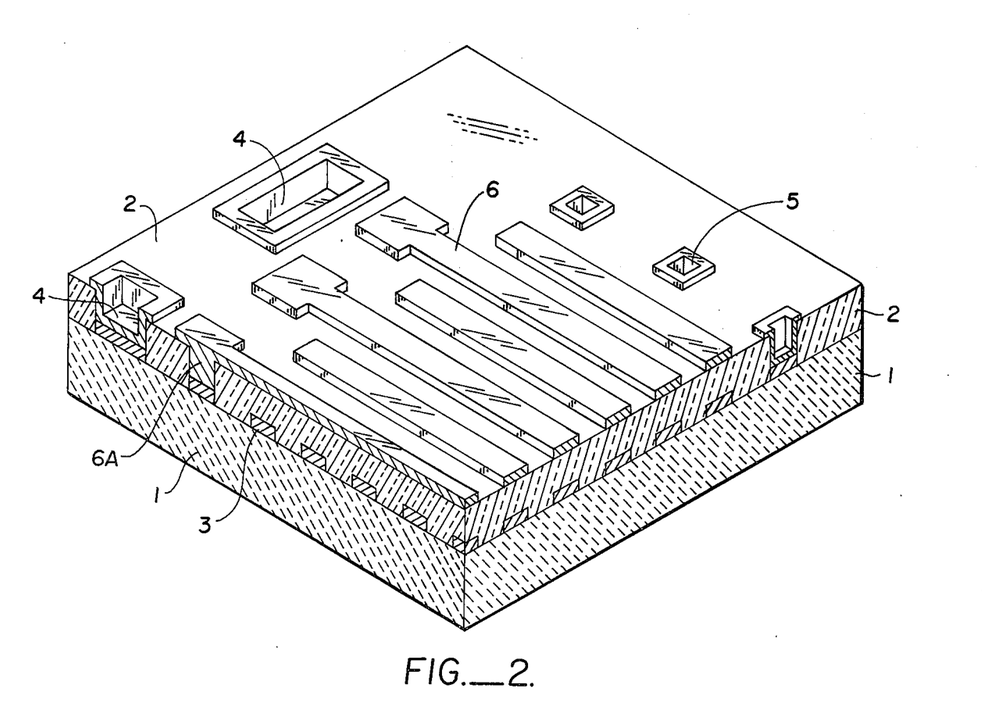

Referring to FIG. 2, after application of non-semiconductor dielectric layer 2, the bottom electrode 6 of the ferroelectric device can then be formed. As in the fabrication of interconnects 3, bottom electrode 6 can be formed by standard photoresist techniques. Again, the bottom electrode should be fabricated from a conductive metal oxide or from a metal or metal alloy which will oxidize to form a conductive oxide as discussed previously. This layer can, for example, be uniformly applied to non-semicondcutor dielectric layer 2 by vacuum deposition whereupon a polymerizable plastic is applied which is polymerized in image-wise configuration and washed away in non-polymerized areas. The bottom electrode material layer is then etched away in non-protected areas forming electrodes 6. At the same time, contact pads 6A can be filled with conductive material in order to functionally connect bottom electrode 6 to semiconductor integrated circuit 1. As an alternative, electrodes 6 can be connected to the integrated circuit at 6A later with conductive material 13, 14 (See FIG. 8).

Figure 3:
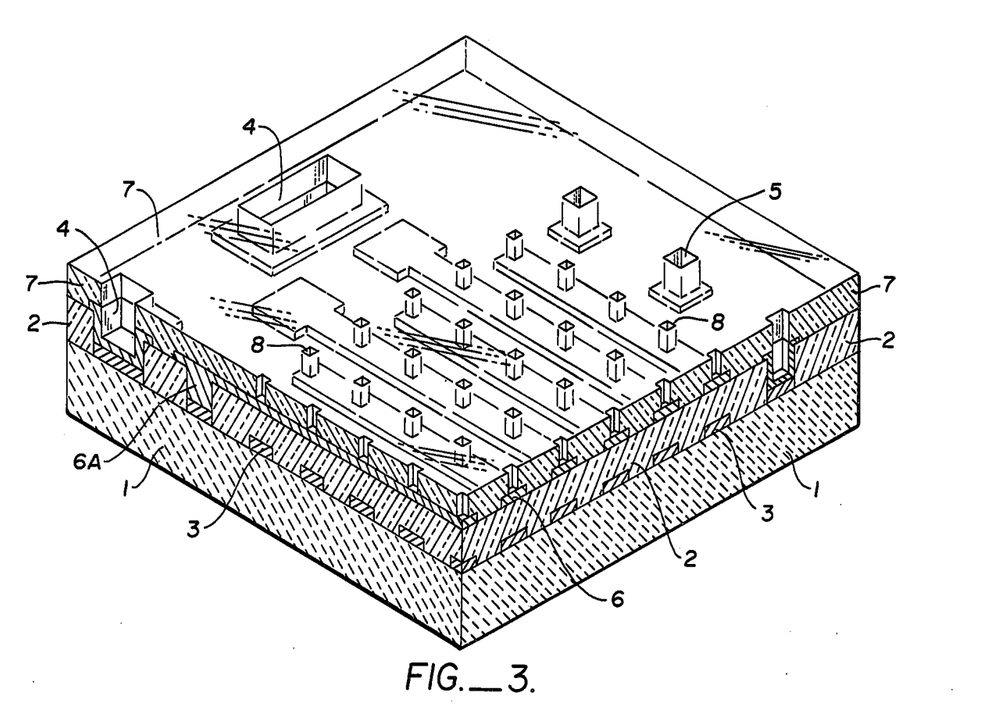

Turning now to FIG. 3, a second non-semiconductor di-electric layer 7 is optionally applied over bottom electrode 6-6A. Because functional contact must be maintained between bottom electrode 6 and the later applied top electrode 11 through ferroelectric layer 9, vias 8 are cut into non-semiconductor dielectric layer 7 at the intersect points between the bottom and top electrodes. Although the use of the second non-semiconductor dielectric is optional, it generally provides for less critical processing tolerances and usually proves beneficial to the electrical performances. As in the bottom non-semiconductor dielectric layer, the upper layer 7 can be composed of CVD glass, silicon nitride or any other appropriate non-semiconductor dielectric material and the vias can be formed, again, by standard photoresist techniques.

At this point, the heart of the ferroelectric device is formed — ferroelectric layer 9. This material is vacuum deposited as a thin film over bottom electrode 6 and non-semiconductor dielectric 7 and is preferably composed of Phase III potassium nitrate which is stable at ordinary room temperature. The ferroelectric layer is intended to have a thickness less than 110 microns and is formed, as taught in U.S. Pat. No. 3,728,694, by vacuum deposition at a specific temperature range. Although not absolutely necessary, the dielectric can be cooled in a predetermined gas, such as nitrogen, without quenching. Care must be taken to prevent moisture from contacting the ferroelectric layer as moisture could destroy its ferroelectric properties.

Figure 4:
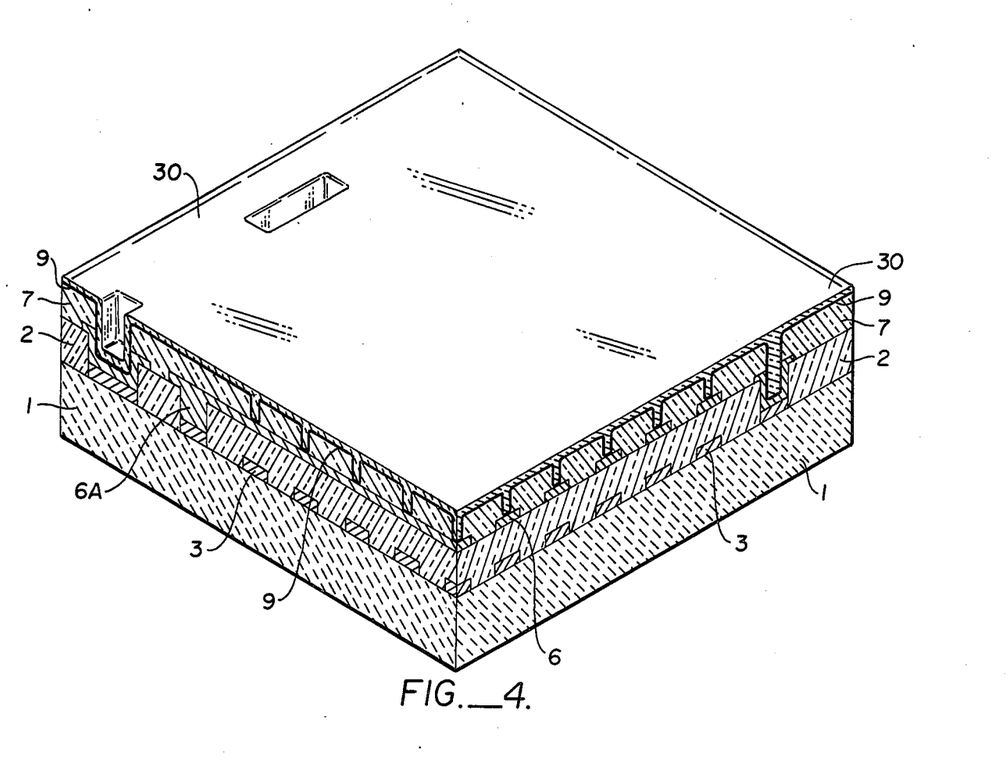

Various ferroelectric materials have been studied for their information storage capability. Although many materials exhibit the ferroelectric phenomenon, the predominent materials previously studied for memory application are barium titanate, potassium dihydrogen phosphate, tri-glycerin sulfate, and Phase III potassium nitrate. Phase III potassium nitrate exhibits a well-defined critical switching threshold and is therefore a preferred ferroelectric material. If potassium nitrate is chosen as the ferroelectric material, a preferred layer thickness is found to be from 100 Angstrom units to 1000 Angstrom units and, within that range, it has been found that optimum results are achieved when the thickness of Phase III potassium nitrate which is stable at standard temperature and pressure has a thickness of less than 1 micron. Referring to FIG. 4, the ferroelectric layer 9 is uniformly applied to non-semiconductor dielectric layer 7. The ferroelectric material uniformly coats the non-semiconductor dielectric and fills the vias and thus contacts selected portions of bottom electrode 6. The "crack filling" insulating layer 30 (FIG. 4) is then applied. During the same pump down or vacuum step which is employed to form the potassium nitrate layer, any suitable insulating layer 30 can be applied by means of evaporation or sputtering although the latter technique is preferred. Examples of suitable insulating materials are $SiO_2$, SiO or SiN. Furthermore, multiple layers of the non-conductive material can be employed to insure a thorough filling of any imperfection 32 (see FIG. 5A) which may exist in the $KNO_3$ layer. By employing any known photoresist techniques, vias are then formed in the insulating layer(s) and the insulating material is sputter etched down to the surface of $KNO_3$ layer 9. The photoresist can be then removed by, for example, sputtering which will result in a $KNO_3$ layer 9 in which the cracks have been filled with an insulator. The surface of layer 9 will be bare for contact with top electrode layer 10. See FIG. 5A which shows a magnified cross-sectional view of the crack filling function of insulator 30 at line 5A—5A of FIG. 5. On top of ferroelectric layer 9 is placed top electrode layer 10 by any of the variously well-known standard techniques. As was stated with regard to the bottom electrode, the top electrode should be fabricated from a conductive metal oxide or from a metal or metal alloy which will oxidize to form a conductive oxide as discussed previously. This layer can be formed, for example, by vacuum deposition or sputtering.

Figures 5, 5A, 6:
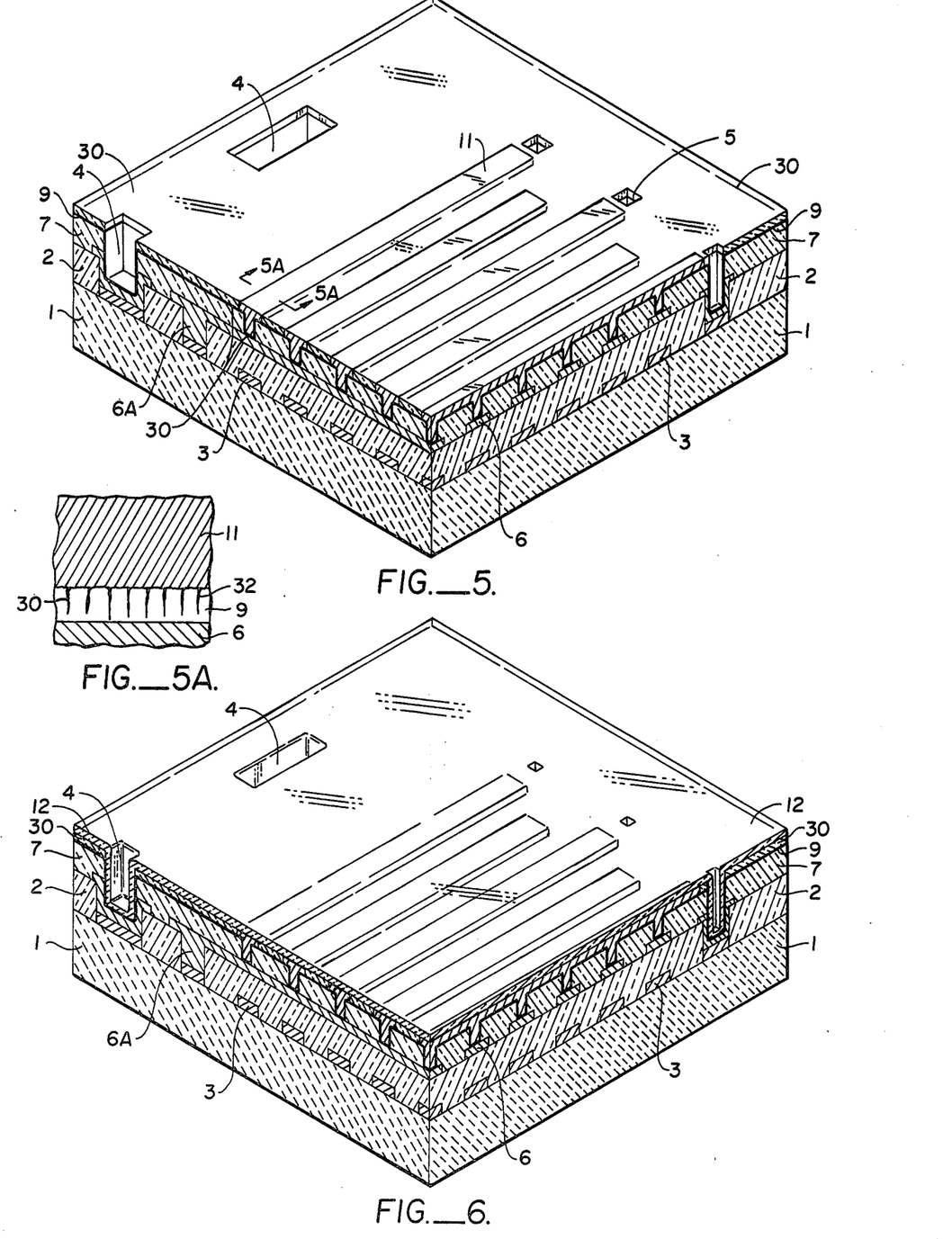

The top electrode 11 can then be configured into its final form as shown in FIG. 5. There are several important considerations which must be noted when forming electrodes 11. If standard photoresist techniques are employed, the acid used to etch conductive layer 10 to form electrodes 11 may adversely affect ferroelectric layer 9 due to the water content of etching solutions. At this point, the critical are of the $KNO_3$ is located in the vias which would be somewhat isolated from etching solutions. If sufficient care is taken to prevent the acidic etching solutions from contacting the $KNO_3$ in the vias, it may be possible to use such solutions. More preferably, unwanted areas of conductive layer 10 can be removed by back sputtering the electrode in image-wise configuration. For example, a photoresist mask can be formed on conductive layer 10 to cover only conductive areas corresponding to final electrode configuration 11. Conductive layer 10 can then be partially etched and then back sputtered to remove the remaining conductive material. If the photoresist mask is of proper thickness, no etching is needed and a back sputtering operation can be used to simultaneously remove unwanted conductive material and portions of the mask covering electrodes 11.

Once top electrode 11 is formed, the entire structure can be covered with a top passivation layer such as passivation glass or silicon nitride to prevent moisture contamination of the ferroelectric layer. If the ferroelectric material is Phase III potassium nitrate, extra care must be taken for this material reverts to another phase and looses its ferroelectric properties in the presence of moisture. If there is little danger of moisture contamination, the top passivation layer 12 shown in FIG. 6 can be eliminated.

Figure 7:
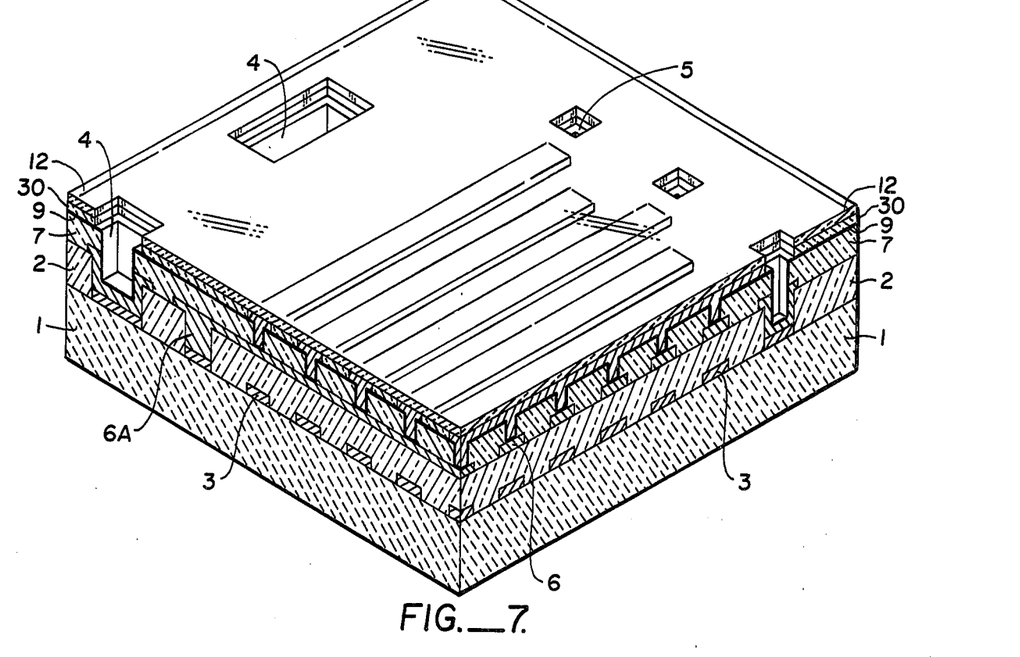
Figure 8:
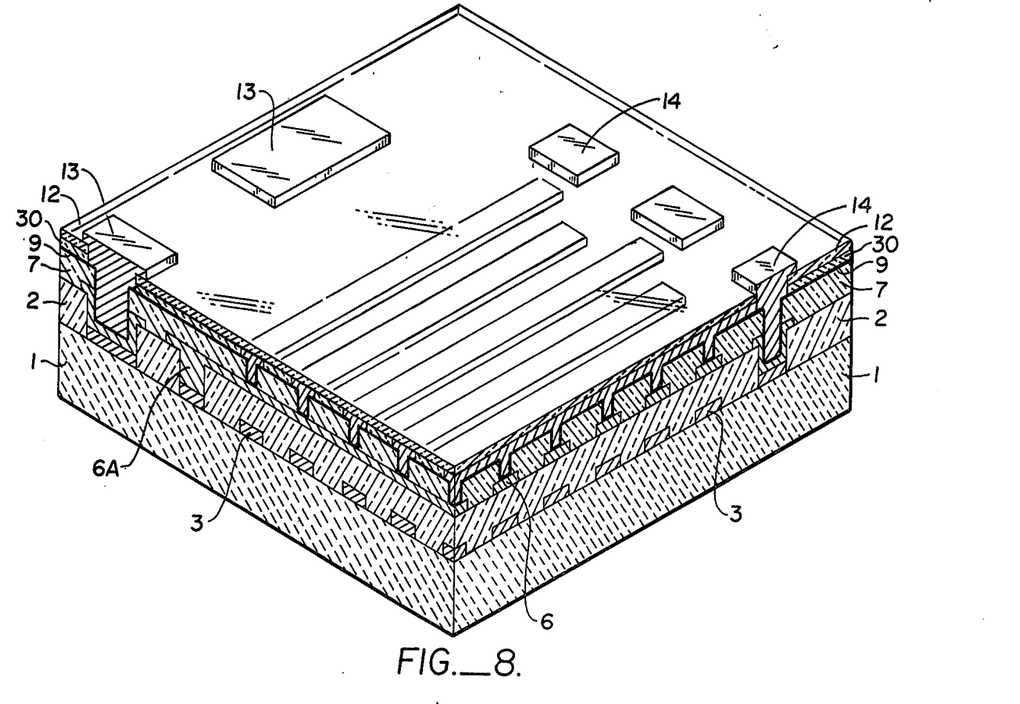

At this point, the passivation glass layer 12 is etched as shown in FIG. 7 using standard photoresist techniques. This is done to aid in filling the bonding and contact pads with conductive material to provide for electrical contact between the top electrode and the IC address circuitry and the semiconductor integrated chip with external access sources. Once this is accomplished, the bonding and contact pads are filled with conductive material 13, 14, resectively, as shown in FIG. 8. The filling of these areas can be done by depositing a uniform layer of conductive material and standard photoresist techniques used to remove it in all areas but in the contact and bonding pads.

The monolithic semiconductor integrated circuit-ferroelectric device is particularly adapted for use in binary systems, i.e., computers and the like, and processes therefor. It was discovered that the ferroelectric devices of the present invention produce an unexpected result in their failure to exhibit a "waiting" effect, a distinct advantage over prior art ferroelectric devices. As stated in U.S. Pat. No. 3,728,694, the unobvious result achieved was attributable to the formation of a crystalline thin film of Phase III potassium nitrate, since similar devices prepared from "bulk" Phase III potassium nitrate exhibit a "waiting time" and are unstable under ambient conditions, i.e., room temperature and pressure over an extended period of time.

Figure 9:
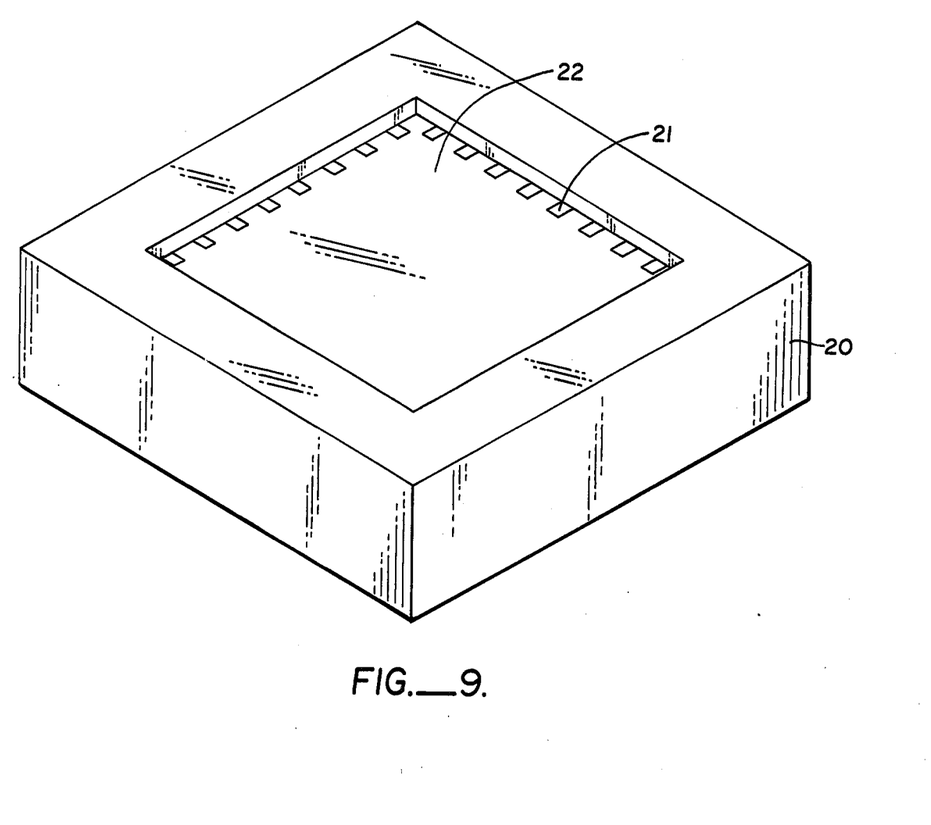
FIG. 9 shows a semiconductor integrated circuit chip for accepting a ferroelectric device within the logic circuitry rather than on top of it.

FIGS. 1–8 deal with the fabrication of a monolithic semiconductor integrated circuit-ferroelectric memory device wherein the memory device is stacked directly upon the semiconductor integrated circuit interconnects. As stated previously, several ferroelectric memory devices may be "stacked" on an IC device and such a configuration is considered part of the present invention. FIG. 9 shows a semiconductor integrated circuit which has been adapted to accept a ferroelectric device where this device is within and surrounded by the interconnects of the semiconductor integrated circuit, rather than being located on top of these elements.

More specifically, the decode integrated circuit logic is contained in area 20 and the interconnects are polytabs or another electrically conductive material emanating from this logic circuit and extending to inner surface 22 at points 21. Surface 22 is flat and is usually composed of $SiO_2$. Fabrication of the ferroelectric device within areas 22 parallels the process steps outlined in FIGS. 1–8. The only difference is that the bottom and top electrodes of the ferroelectric device are connected to predetermined polytabs at the periphery of the ferroelectric device rather than to interconnects below the ferroelectric device of the previous embodiment. The only substantive difference of the previous embodiment. The only substantive difference in the process staps would be elimination of the need for insulating the bottom electrode from the interconnects, i.e., the elimination of layer 2 in FIG. 1. Other then that, the steps are identical.

While the present invention has been particularly shown and described with reference to preferred embodiments, it will be understood by those in the art that changes and modifications and form and details may be made without departing from the spirit and scope of the present invention.

What is claimed is:

1. A method of fabricating a monolithic semiconductor integrated circuit and ferroelectric memory device comprising:
   A. forming first layer interconnects on the surface of a semiconductor integrated circuit;
   B. depositing a non-semiconductor dielectric and forming interconnect and bonding pad vias therein;
   C. depositing a conductive layer and forming a bottom electrode;
   D. applying a ferroelectric layer;
   E. filling any imperfections in said ferroelectric layer with insulative material;
   F. depositing a conductive layer and forming a top electrode wherein said conductive layer is selected from the group consisting essentially of conductive metal oxides, metals and metal alloys which will oxidize to form conductive oxides; and
   G. applying conductive material to the bonding and interconnect pads.

2. The method of claim 1 wherein said ferroelectric layer substantially comprises Phase III potassium nitrate.

3. The method of claim 1 wherein said first layer interconnections are composed of doped polysilicon.

4. The method of claim 1 wherein said non-semiconductor dielectric is selected from the group consisting of low temperature glass, silicon nitride and sputtered dielectrics.

5. The method of claim 1 wherein said first layer interconnections are composed of a metal.

6. The method of claim 1 wherein said top and bottom electrodes are metals or metal alloys which are applied by reactive sputtering in the pressence of oxygen.

7. The method of claim 1 wherein said ferroelectric KNO$_3$ layer has a thickness less than 110 microns.

8. The method of claim 1 wherein said ferroelectric KNO$_3$ layer has a thickness within a range of from 100 Angstrom units to 5,000 Angstrom units.

9. The method of claim 1 wherein said ferroelectric potassium nitrate layer has a thickness of less than 1 micron and comprises Phase III potassium nitrate which is stable at standard temperature and pressure.

10. The method of claim 9 wherein said first layer interconnections are composed of materials selected from the group consisting essentially of conductive metal oxides, metals and metal alloys which will oxidize to form conductive metal oxides.

11. The method of claim 1 wherein the top electrode is formed by defining the top conductive layer by standard photoresist techniques and back sputtering said metal layer until the top electrode is defined.

12. The method of claim 11 wherein the top conductive layer is partially etched before subjecting it to back sputtering.

13. A method of fabricating a monolithic semiconductor integrated circuit and ferroelectric memory device comprising:
  A. forming first layer interconnects on the surface of a semiconductor integrated circuit;
  B. depositing a non-semiconductor dielectric and cutting interconnect and bonding pad vias therein;
  C. depositing a conductive layer and forming a bottom electrode;
  D. depositing a second non-semiconductor dielectric and forming vias therein;
  E. applying a ferroelectric layer;
  F. filling any imperfections in said ferroelectric layer with insulative material; and
  G. applying conductive material to the bonding and interconnect pads.

14. The method of claim 13 wherein said ferroelectric layer substantially comprises Phase III potassium nitrate.

15. The method of claim 13 wherein said first layer interconnections are composed of doped polysilicon.

16. The method of claim 13 wherein said non-semiconductor dielectric is selected from the group consisting of low temperature glass, silicon nitride and sputtered dielectrics.

17. The method of claim 13 wherein said first layer interconnections are composed of a metal.

18. A method of fabricating a monolithic semiconductor integrated circuit and ferroelectric memory device comprising:
  A. forming first layer interconnects on the surface of a semiconductor integrated circuit;
  B. depositing a non-semiconductor dielectric and cutting interconnect and bonding pad vias therein;
  C. depositing a conductive layer and forming a bottom electrode;
  D. depositing a second non-semiconductive dielectric and forming vias therein;
  E. applying a ferroelectric layer;
  F. filling any imperfections in said ferroelectric layer with insulative material;
  G. depositing a conductive layer and forming a top electrode;
  H. depositing a top non-semiconductor dielectric layer uniformly;
  I. removing said top non-semiconductor dielectric layer from the bonding and interconnect pads; and
  J. applying conductive material to the bonding and interconnect pads.

19. The method of claim 18 wherein said ferroelectric layer substantially comprises Phase III potassium nitrate.

20. The method of claim 18 wherein said first layer interconnections are composed of doped polysilicon.

21. The method of claim 18 wherein said non-semiconductor dielectric is selected from the group consisting of low temperature glass, silicon nitrate and sputtered dielectrics.

22. The method of claim 18 wherein said first layer interconnections are composed of a metal.

23. A method of fabricating a monolithic semiconductor integrated circuit and ferroelectric memory device comprising:
  A forming first layer interconnects on the surface of a semiconductor integrated circuit;
  B. depositing a non-semiconductor dielectric and forming interconnect and bonding pad via therein;
  C. depositing a conductive layer and forming a bottom electrode wherein said conductive layer is selected from the group consisting essentially of conductive metal oxides, metals and metal alloys which will oxidize to form conductive oxides;
  D. applying a ferroelectric layer;
  E. depositing a conductive layer and forming a top electrode wherein said conductive layer is selected from the group consisting essentially of conductive metal oxides, metals and metal alloys which will oxidize to form conductive oxides; and
  F. applying conductive material to the bonding and interconnect pads.

24. The method of claim 23 wherein said ferroelectric layer substantially comprises Phase III potassium nitrate.

25. The method of claim 23 wherein said first layer interconnections are composed of doped polysilicon.

26. The method of claim 23 wherein said non-semiconductor dielectric is selected from the group consisting of low temperature glass, silicon nitride and sputtered dielectrics.

27. The method of claim 23 wherein said first layer interconnections are composed of a metal.

28. The method of claim 23 wherein said top and bottom electrodes comprise conductive materials selected from the group consisting of indium-tin oxide, tin oxide and palladium oxide.

29. The method of claim 23 wherein said top and bottom electrodes are conductive metal oxides which are applied by RF sputtering.

30. The method of claim 23 wherein said top and bottom electrodes and metals or metal alloys which are applied by reactive sputtering in the presence of oxygen.

31. The method of claim 23 wherein said first layer interconnections are composed of materials selected from the group consisting essentially of conductive metal oxides, metals and metal alloys which will oxidize to form conductive metal oxides.

32. The method of claim 23 wherein said ferroelectric KNO$_3$ layer has a thickness less than 110 microns.

33. The method of claim 23 wherein said ferroelectric KNO$_3$ layer has a thickness within a range of from 100 Angstrom units to 5,000 Angstrom units.

34. The method of claim 22 wherein said ferroelectric potassium nitrate layer has a thickness of less than 1 micron and comprises Phase III potassium nitrate which is stable at standard temperature and pressure.

35. The method of claim 23 wherein the top electrode is formed by defining the top conductive layer by standard photo-resist techniques and back sputtering said metal layer until the top electrode is defined.

36. The method of claim 35 wherein the top conductive layer is partially etched before subjecting it to back sputtering.

37. A method of fabricating a monolithic semiconductor integrated circuit and ferroelectric memory device comprising:
  A. forming first layer interconnects on the surface of a semiconductor integrated circuit;
  B. depositing a non-semiconductor dielectric and cutting interconnect and bonding pad vias therein;
  C. depositing a conductive layer and forming a bottom electrode wherein said conductive layer is selected from the group consisting essentially of conductive metal oxides, metals and metal alloys which will oxidize to form conductive oxides;
  D. depositing a second non-semiconductor dielectric and forming vias therein;
  E. applying a ferroelectric layer;
  F. depositing a conductive layer and forming a top electrode wherein said conductive layer is selected from the group consisting essentially of conductive metal oxides, metals and metal alloys which will oxidize to form conductive oxides; and
  G. applying conductive material to the bonding and interconnect pads.

38. The method of claim 37 wherein said ferroelectric layer substantially comprises Phase III potassium nitrate.

39. The method of claim 37 wherein said first layer interconnections are composed of doped polysilicon.

40. The method of claim 37 wherein said non-semiconductor dielectric is selected from the group consisting of low temperature glass, silicon nitride and sputtered dielectrics.

41. The method of claim 37 wherein said first layer interconnections are composed of a metal.

42. The method of claim 37 wherein said top and bottom electrodes comprise conductive materials selected from the group consisting of indium-tin oxide, tin oxide and palladium oxide.

43. The method of claim 37 wherein said top and bottom electrodes are conductive metal oxides which are applied by RF sputtering.

44. The method of claim 37 wherein said top and bottom electrodes are metals or metal alloys which are applied by reactive sputtering in the presence of oxygen.

45. The method of claim 37 wherein said first layer interconnections are composed of materials selected from the group consisting essentially of conductive metal oxides, metals and metal alloys which will oxidize to form conductive metal oxides.

46. A method of fabricating a monolithic semiconductor integrated circuit and ferroelectric memory device comprising:
  A. forming first layer interconnects on the surface of a semiconductor integrated circuit;
  B. depositing a non-semiconductor dielectric and cutting interconnect and bonding pad vias therein;
  C. depositing a conductive layer and forming a bottom electrode wherein said conductive layer is selected from the group consisting essentially of conductive metal oxides, metals and metal alloys which will oxidize to form conductive oxides;
  D. depositing a second non-semiconductive dielectric and forming vias therein;
  E. applying a ferroelectric layer;
  F. depositing a conductive layer and forming a top electrode wherein said conductive layer is selected from the group consisting essentially of conductive metal oxides, metals and metal alloys which will oxidize to form conductive oxides;
  G. depositing a top non-semiconductor dielectric layer uniformly;
  H. removing said top non-semiconductor dielectric layer from the bonding and interconnect pads; and
  I. applying conductive material to the bonding and interconnect pads.

47. The method of claim 46 wherein said ferroelectric layer substantially comprises Phase III potassium nitrate.

48. The method of claim 46 wherein said first layer interconnections are composed of doped polysilicon.

49. The method of claim 46 wherein said non-semiconductor dielectric is selected from the group consisting of low temperature glass, silicon nitrate and sputtered dielectrics.

50. The method of claim 46 wherein said first layer interconnections are composed of a metal.

51. The method of claim 46 wherein said top and bottom electrodes comprise conductive materials selected from the group consisting of indium-tin oxide, tin oxide and palladium oxide.

52. The method of claim 46 wherein said top and bottom electrodes and conductive metal oxides which are applied by RF sputtering.

53. The method of claim 46 wherein said top and bottom electrodes are metals or metal alloys which are applied by reactive sputtering in the presence of oxygen.

* * * * *